(12) United States Patent
Sugimoto et al.

(10) Patent No.: US 10,172,234 B2
(45) Date of Patent: Jan. 1, 2019

(54) WIRED CIRCUIT BOARD

(71) Applicant: NITTO DENKO CORPORATION, Osaka (JP)

(72) Inventors: Yuu Sugimoto, Osaka (JP); Hiroyuki Tanabe, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 0 days.

(21) Appl. No.: 15/386,755

(22) Filed: Dec. 21, 2016

(65) Prior Publication Data

US 2017/0188453 A1 Jun. 29, 2017

(30) Foreign Application Priority Data

Dec. 25, 2015 (JP) .................. 2015-254339

(51) Int. Cl.
*H05K 1/02* (2006.01)
*G11B 5/48* (2006.01)
*H05K 1/05* (2006.01)
*H05K 1/03* (2006.01)
*H05K 3/10* (2006.01)

(52) U.S. Cl.
CPC .......... *H05K 1/0296* (2013.01); *G11B 5/486* (2013.01); *H05K 1/056* (2013.01); *G11B 5/4853* (2013.01); *H05K 1/0277* (2013.01); *H05K 1/0393* (2013.01); *H05K 3/108* (2013.01); *H05K 2201/0191* (2013.01)

(58) Field of Classification Search
CPC .. H05K 1/0296; H05K 1/0277; H05K 1/0278; H05K 1/028; H05K 1/0281; H05K 1/0283; H05K 1/0393; H05K 1/118; H05K 1/147; H05K 1/148; H05K 1/189; H05K 2201/042; H05K 2201/046; H05K 2201/05; H01L 24/50
See application file for complete search history.

(56) References Cited

U.S. PATENT DOCUMENTS

| | | | | |
|---|---|---|---|---|
| 6,252,176 | B1* | 6/2001 | Kuramochi | ............ H05K 1/024 174/254 |
| 7,652,890 | B2* | 1/2010 | Ohsawa | ................ G11B 5/486 174/254 |
| 9,029,708 | B2* | 5/2015 | Oosawa | ............... H05K 1/0245 174/254 |
| 9,301,406 | B2* | 3/2016 | Higuchi | ................ G11B 5/486 |
| 2014/0177106 | A1 | 6/2014 | Shirafuji | |

FOREIGN PATENT DOCUMENTS

JP 2014-127216 A 7/2014

* cited by examiner

*Primary Examiner* — Ishwarbhai B Patel
(74) *Attorney, Agent, or Firm* — Edwards Neils LLC; Jean C. Edwards, Esq.

(57) ABSTRACT

The wired circuit board includes an insulating layer and a conductive pattern provided on the insulating layer. The insulating layer has an inclined face and a flat face, and a supplementary angle y to an angle formed by the inclined face and the flat face is more than 0 degree and 20 degrees or less.

2 Claims, 8 Drawing Sheets

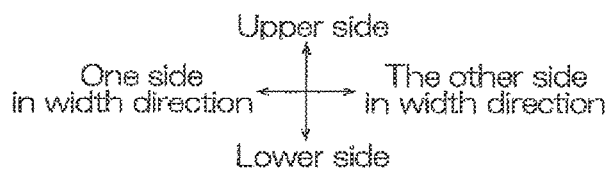
FIG. 1A Step (i)
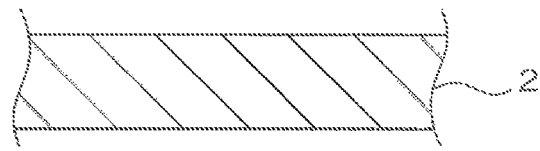
FIG. 1B Step (ii)
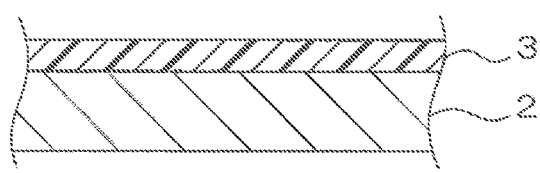
FIG. 1C Step (iii)
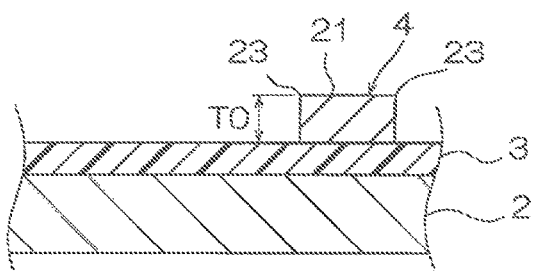
FIG. 1D Step (1)
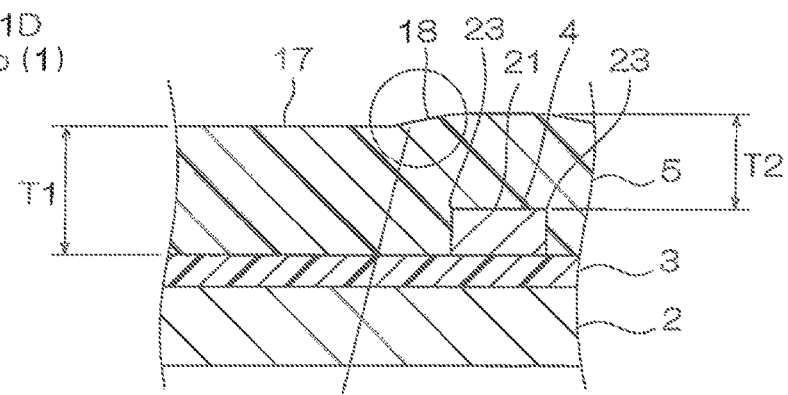
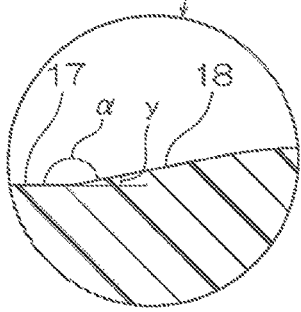

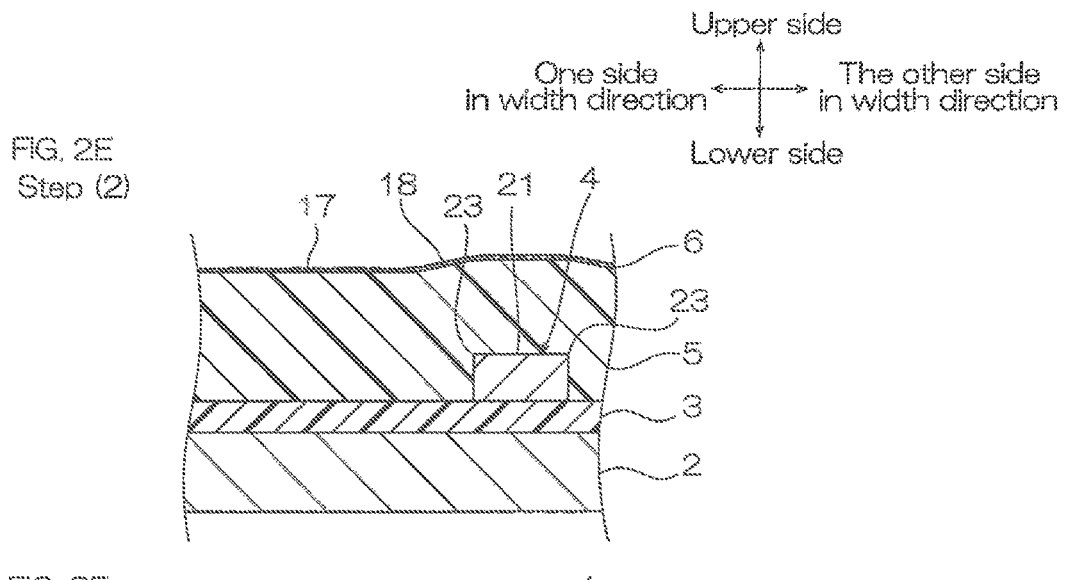
FIG. 2E Step (2)
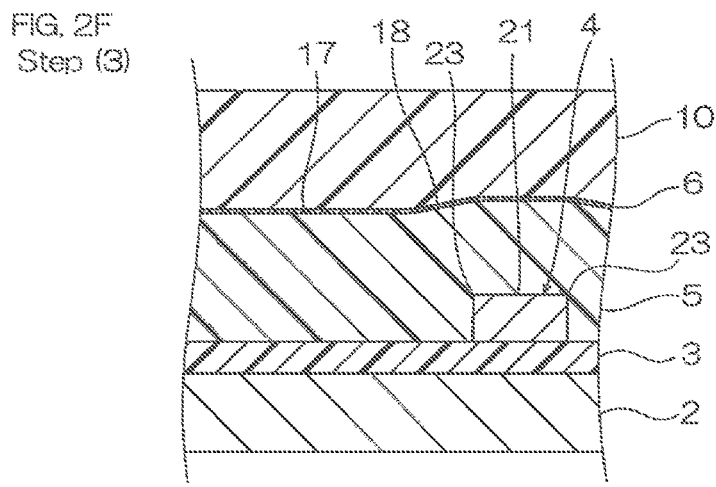
FIG. 2F Step (3)
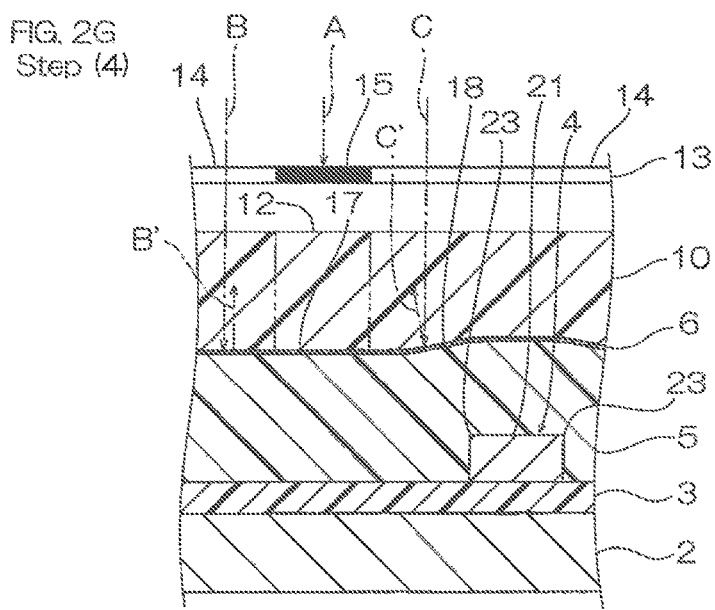
FIG. 2G Step (4)

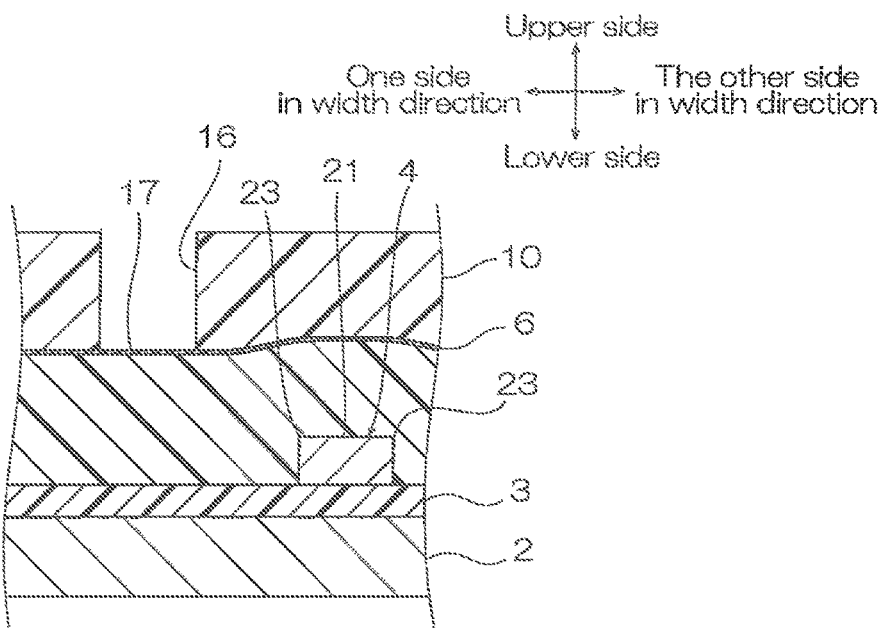
FIG. 3H Step (5)
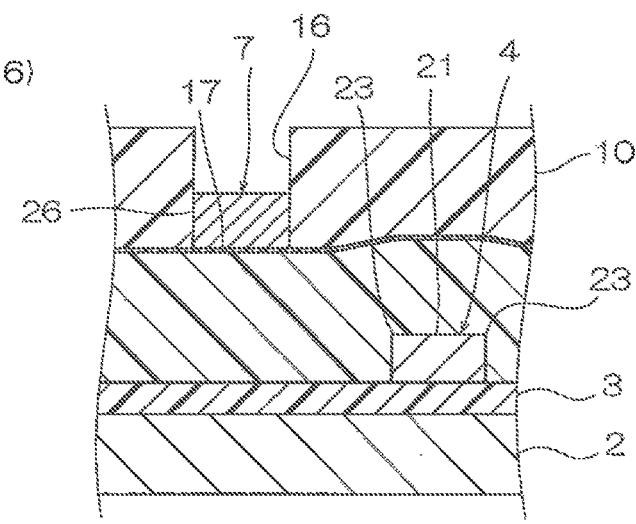
FIG. 3I Step (6)
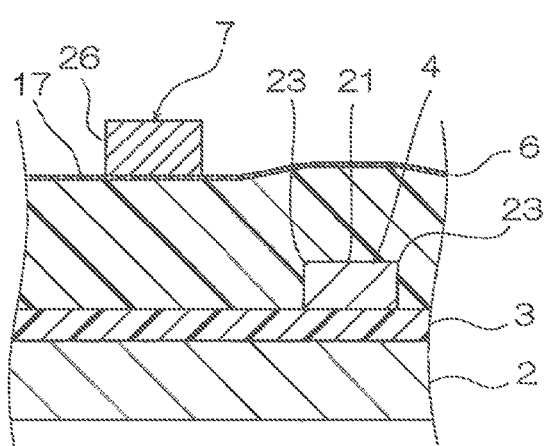
FIG. 3J Step (iv)

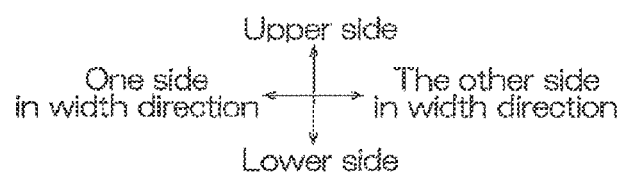
FIG. 4K
Step (v)
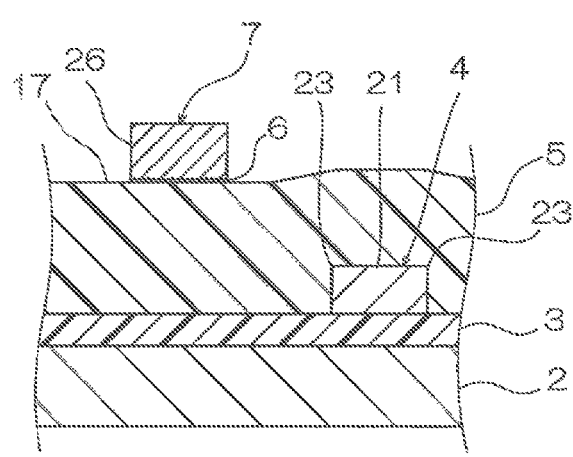
FIG. 4L
Step (vi)
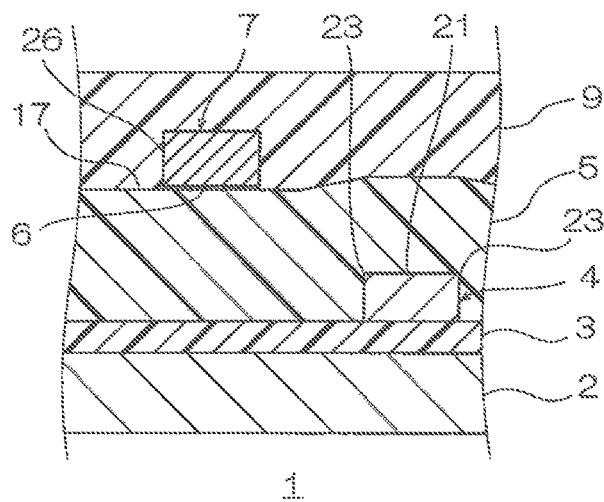

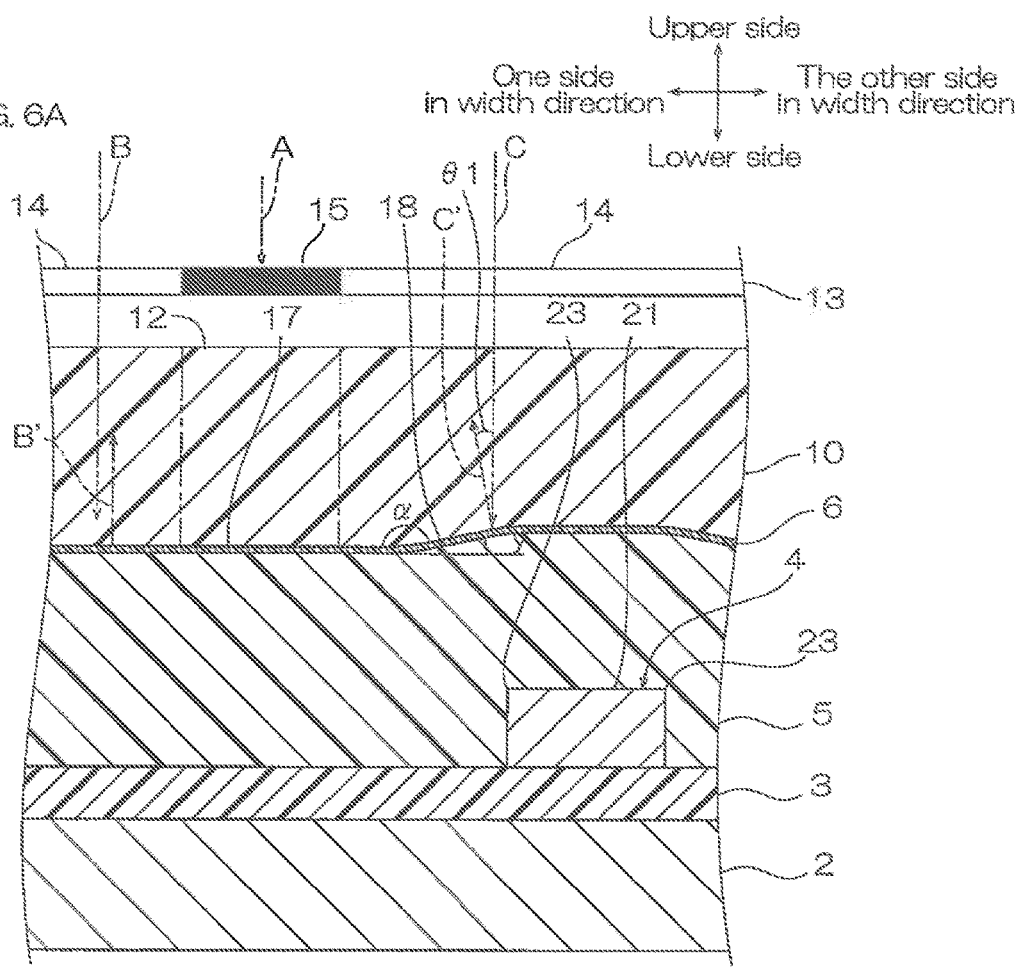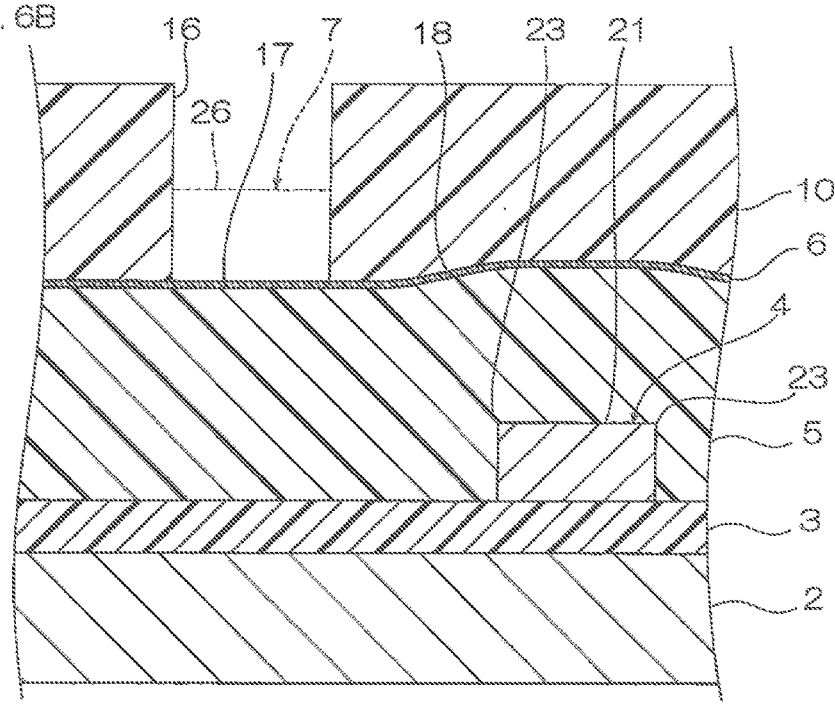

WIRED CIRCUIT BOARD

CROSS-REFERENCE TO RELATED APPLICATION

The present application claims priority from Japanese Patent Application No. 2015-254339 filed on Dec. 25, 2015, the contents of which are hereby incorporated by reference into this application.

BACKGROUND OF THE INVENTION

Field of the Invention

The present invention relates to a wired circuit board.

Description of Related Art

The wired circuit board includes an insulating layer and a wiring pattern thereon.

For example, Japanese Unexamined Patent Publication No. 2014-127216 has proposed a method for producing a suspension board with circuit: the method includes a step of forming a first portion having a first thickness and a second portion having a second thickness that is smaller than the first thickness in the insulating layer, and a step of forming a wiring pattern so as to extend on the first portion and the second portion of the insulating layer.

To be specific, in the production method described in Japanese Unexamined Patent Publication No. 2014-127216, in the step of forming the wiring pattern, the wiring pattern is formed on the top face of the insulating layer so that the boundary between the top face and the boundary face of the first portion extends in a first direction, the side of the wiring pattern extends in a second direction crossing the first direction, and the second direction forms an angle of 60 degrees or more and 90 degrees or less relative to the first direction.

Because the boundary face is formed between the top face of the first portion and the top face of the second portion, in the step of forming the wiring pattern on the insulating layer by photo lithography technology, reflection of exposure light is caused at the boundary face, and the reflected light applies indirectly to other regions. However, in the method described in Japanese Unexamined Patent Publication No. 2014-127216, the exposure light is reflected in a direction that is close to the direction in which the wiring pattern extends at the boundary face, and therefore the reflected light substantially does not affect the pattern of the original exposure light. Thus, breakage or short circuit is prevented in the wiring pattern formed by the photo lithography technology.

SUMMARY OF THE INVENTION

Recently, when producing a small-sized wired circuit board, sometimes a wiring pattern is disposed with a complicated pattern. In such a case, it may be difficult to form the wiring pattern so as to form an angle between the second direction and the first direction to be 60 degrees or more and 90 degrees or less as did in Japanese Unexamined Patent Publication No. 2014-127216. Then, there are disadvantages in that inadequate formation of the wiring pattern cannot be prevented.

The present invention provides a wired circuit board including a conductive pattern: in the wired circuit board of the present invention, inadequate formation of the conductive pattern is suppressed, and the layout of the conductive pattern is made with high flexibility.

The present invention (1) includes a wired circuit board including an insulating layer and a conductive pattern provided on the insulating layer, wherein the insulating layer has an inclined face and a flat face, and a supplementary angle y to an angle formed by the inclined face and the flat face is more than 0 degree and 20 degrees or less.

With the wired circuit board, the supplementary angle y is the above-described upper limit value or less, and therefore the angle formed between incident light and reflected light reflected at the metal thin film corresponding to the inclined face can be made small. Therefore, reflected light can be substantially projected upward, and as a result, a conductive pattern in which inadequate formation is suppressed can be provided.

With the wired circuit board of the present invention, a conductive pattern in which inadequate formation is suppressed can be provided.

BRIEF DESCRIPTION OF THE DRAWINGS

FIG. 1A to FIG. 1D show process diagrams for a method for producing a suspension board with circuits as an embodiment of the wired circuit board of the present invention, FIG. 1A illustrating a step (i), in which a metal supporting board is prepared, FIG. 1B illustrating a step (ii), in which an insulating base layer is provided, FIG. 1C illustrating a step (iii), in which a first conductive pattern is provided, and FIG. 1D illustrating a step (1), in which an intermediate insulating layer is provided.

FIG. 2E to FIG. 2G show, following FIG. 1D, process diagrams for a method for producing the suspension board with circuits in an embodiment, FIG. 2E illustrating a step (2), in which a metal thin film is provided, FIG. 2F illustrating a step (3), in which a photoresist is provided, and FIG. 2G illustrating a step (4), in which a photoresist is exposed to light.

FIG. 3H to FIG. 3J show, following FIG. 2G, process diagrams for a method for producing the suspension board with circuits in an embodiment, FIG. 3H illustrating a step (4), in which a to-be-portion in the photoresist is developed, FIG. 3I illustrating a step (5), in which a second conductive pattern is provided, and FIG. 3J illustrating a step (iv), in which the photoresist is removed.

FIG. 4K and FIG. 4 L show, following FIG. 3J, process diagrams for a method for producing the suspension board with circuits in an embodiment, FIG. 4K illustrating a step (v), in which the metal thin film corresponding to the photoresist is removed, and FIG. 4 L illustrating a step (vi), in which an insulating cover layer is provided.

FIG. 6A and FIG. 6 are enlarged views of the step (4),

FIG. 6A illustrating an enlarged view of FIG. 2G, and

FIG. 6B an enlarged view of FIG. 3H.

DETAILED DESCRIPTION OF THE INVENTION

Figure 5:
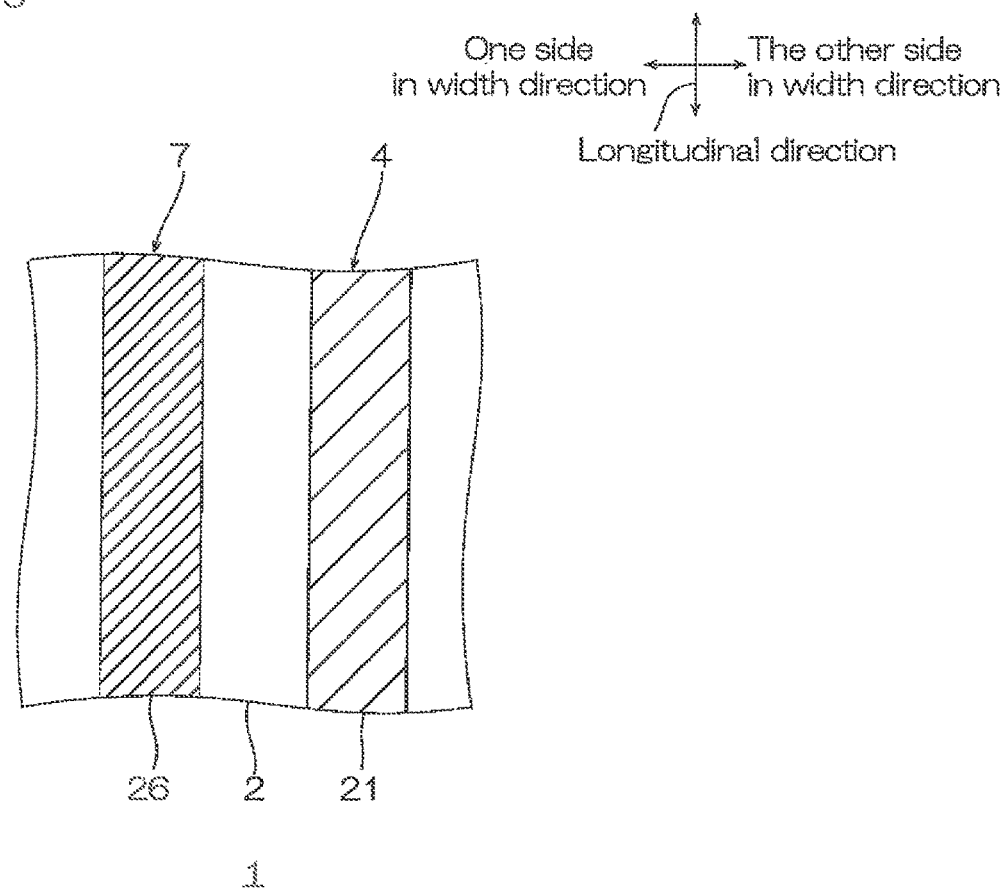
FIG. 5 shows a partial plan view (insulating base layer, intermediate insulating layer, and insulating cover layer are omitted) of the suspension board with circuits in an embodiment.

In FIG. 1A to FIG. 1D, up-down direction in the plane of the paper is referred to as up-down direction (first direction, thickness direction), the upper side in the plane of the sheet is upper side (one side in the first direction, one side in the thickness direction), lower side in the plane of the paper is lower side (the other side in the first direction, the other side in the thickness direction). Left-right direction in the plane of the paper is width direction (surface direction, second direction perpendicular to first direction), left side in the plane of the sheet is one side in the width direction (one side in the second direction), right side in the plane of the sheet is the other side in the width direction (the other side in the second direction). To be specific, the directions are based on the direction arrows shown in the figures.

In the following, a suspension with a circuit of an embodiment of the wired circuit board of the present invention, and a production method thereof are described.

1. Suspension Board with Circuits

The suspension board with circuits 1 includes, as shown in FIG. 4 L, a metal supporting board 2, an insulating base layer 3 provided on the metal supporting board 2, a first conductive pattern 4 provided on the insulating base layer 3, an intermediate insulating layer 5 provided on the insulating base layer 3 and covering the first conductive pattern 4, a metal thin film 6 and a second conductive pattern 7 disposed on the intermediate insulating layer 5, and an insulating cover layer 9 provided on the intermediate insulating layer 5 and covering the metal thin film 6 and the second conductive pattern 7. In the suspension board with circuits 1, the metal thin film 6 is integrated with the second conductive pattern 7, to be specific, the metal thin film 6 is incorporated as a portion of the second conductive pattern 7.

2. Production Method of Suspension Board with Circuits

In the method for producing a suspension board with circuits 1, the step (i) to step (iii), step (1) to step (6), and step (iv) to step (vi) are performed sequentially. In the following, the above-described steps are described in detail.

2-1. Step (i)

As shown in FIG. 1A, in the step (i), a metal supporting board 2 is prepared.

The metal supporting board 2 has a generally flat plate (sheet) shape extending in front-back direction. The metal supporting board 2 is made of a metal material. Examples of the metal material include stainless steel, 42 alloy, aluminum, copper-beryllium, and phosphor bronze, and preferably, stainless steel is used. The metal supporting board 2 has a thickness of, for example, 10 μm or more, preferably 15 μm or more, and for example, 35 μm or less, preferably 25 μm or less.

2-2. Step (ii)

As shown in FIG. 1B, in the step (ii), the insulating base layer 3 is provided on the metal supporting board 2.

The insulating base layer 3 is disposed on the entire top face of the metal supporting board 2. The insulating base layer 3 has a generally flat plate (sheet) shape extending in front-back direction. The insulating base layer 3 is made of an insulating material. Examples of the insulating material include synthetic resins such as polyimide resin, polyamide-imide resin, acrylic resin, polyether resin, nitrile resin, polyether sulfone resin, polyethylene terephthalate resin, polyethylenenaphthalate resin, and polyvinyl chloride resin, and preferably, polyimide resin is used. The insulating base layer 3 has a thickness of, for example, 1 μm or more, preferably 3 μm or more, and for example, 25 μm or less, preferably 15 μm or less.

To provide the insulating base layer 3 on the metal supporting board 2, a known method is used.

2-3. Step (iii)

As shown in FIG. 1C, in the step (iii), the first conductive pattern 4 is provided on the insulating base layer 3.

The first conductive pattern 4 is disposed on the upper face of the insulating base layer 3.

The first conductive pattern 4 integrally includes, as shown in FIG. 5, a plurality of first wires 21 (only single wire is shown in FIG. 1C and in FIG. 5) extending in front-back direction, and first terminals (not shown) connected to both front and rear end portions of the plurality of first wires 21. As shown in FIG. 1C, the first wire 21 has, for example, when viewed in cross section, a generally rectangular shape having a width direction length (width) that is longer than an up-down direction length (thickness). The first wire 21 has two ridgeline portions 23 at the upper end portions. The first conductive pattern 4 is made of a conductive material. For the conductive material, for example, copper, nickel, gold, solder, or alloys thereof are used, and preferably, copper is used.

The size of the first conductive pattern 4 is set suitably. The first conductive pattern 4 has a thickness T0 of, for example, 1 μm or more, preferably 3 μm or more, and for example, 20 μm or less, preferably 12 μm or less. The first wire 21 has a width of, for example, 5 μm or more, preferably 8 μm or more, and for example, 200 μm or less, preferably 100 μm or less. The interval between the first wires 21 that are adjacent to each other is, for example, 5 μm or more, preferably 8 μm or more, and for example, 200 μm or less, preferably 100 μm or less.

To provide the first conductive pattern 4 on the insulating base layer 3, a known method is used.

2-4. Step (1)

As shown in FIG. 1D, in the step (1), the intermediate insulating layer 5 is provided on the insulating base layer 3 so as to cover the first conductive pattern 4.

The intermediate insulating layer 5 covers the first wire 21, and has a pattern that allows the first terminal, which is not shown, to expose. The intermediate insulating layer 5 is made of the insulating material that is the same as that of the insulating base layer 3.

The intermediate insulating layer 5 has, as shown in FIG. 6A, a top face including a flat face 17 and an inclined face 18. The flat face 17 is a face that is parallel to the surface direction (direction along the surface of the insulating base layer 3), and is a face that faces the top face of the insulating base layer 3 exposed from the first conductive pattern 4 in the thickness direction.

Meanwhile, the inclined face 18 is a top face corresponding to the first wire 21 and continuing from the flat face 17, and is a face that is inclined relative to the surface direction. To be specific, the inclined face 18 is a face that corresponds to the two ridgeline portions 23 of the first wire 21, and that inclines (swells) upward from the flat face 17.

The supplementary angle y to angle α formed with the inclined face 18 and the flat face 17, that is, the gradient of the inclined face 18 relative to the flat face 17 is, more than 0 degree, and furthermore, 5 degrees or more. The supplementary angle y is, for example, 20 degrees or less, preferably less than 20 degrees, more preferably 15 degrees or less, further preferably 12 degrees or less.

The angle α is, when the inclined face 18 is curved, an angle formed with the flat face 17 and the face of the portion of the inclined face 18 rising from the flat face 17.

When the supplementary angle y is below the above-described upper limit, light projected to the to-be-portion 12 can be reliably reduced in the step (4) (ref: FIG. 2G and FIG. 6A) described later.

The thickness T1 of the intermediate insulating layer 5 is a distance between the top face of the insulating base layer 3 and the top face of the intermediate insulating layer 5, and for example, more than 6 μm, preferably 9 μm or more, more preferably 12 μm or more, and 20 μm or less. In the intermediate insulating layer 5, the thickness T2 of the portion above the first wire 21 is a distance between the top face of the first wire 21 and the top face of the intermediate insulating layer 5, and for example, more than 5 μm, preferably 8 μm or more, more preferably 10 μm or more, and 15 μm or less.

The ratio of the thickness T1 of the intermediate insulating layer 5 relative to the thickness T0 of the first conductive pattern 4 (T1/T0) is, for example, 1.0 or more, preferably 1.2 or more, more preferably 1.5 or more, more preferably 1.6 or more, and 5 or less.

When the ratio (T1/T0) is the above-described lower limit or more, the above-described supplementary angle y can be made reliably below the above-described upper limit.

To provide the intermediate insulating layer 5 on the insulating base layer 3, for example, varnish of the insulating material of the photosensitive is applied to the top face of the insulating base layer 3, exposed to light and developed, and thereafter, as necessary, heated. Alternatively, an intermediate insulating layer 5 preformed into a pattern which allows a first terminal, which is not shown, to be exposed is allowed to adhere onto the insulating base layer 3 with an adhesive, which is not shown, interposed therebetween.

2-5. Step (2)

As shown in FIG. 2E, in the step (2), the metal thin film 6 is provided on at least the inclined face 17 of the intermediate insulating layer 5.

The metal thin film 6 can be served as a seed film for the additive method in the step (6) (described later, ref: FIG. 3I). The metal thin film 6 is a layer that can be integrated with the second conductive pattern 7 when the second conductive pattern 7 is produced by the additive method.

The metal thin film 6 is provided, for example, on the entire top face of the intermediate insulating layer 5 (including the flat face 17 and the inclined face 18). The metal thin film 6 is made of a metal material. Examples of the metal material include copper, chromium, nickel, and alloys thereof, and preferably, copper and chromium are used. The metal thin film 6 can be made of a single layer or multiple layers (not shown in FIG. 2E). Preferably, the metal thin film 6 is made of two layers of a first thin film (to be specific, chromium thin film) and a second thin film (copper thin film) provided thereon.

The metal thin film 6 is in conformity with the top face of the intermediate insulating layer 5. Therefore, in the metal thin film 6, the top face of a portion corresponding to the flat face 17 is parallel to the flat face 17 of the intermediate insulating layer 5, that is, along the surface direction. Also, in the metal thin film 6, the top face of a portion corresponding to the inclined face 18 is parallel to the inclined face 18 of the intermediate insulating layer 5, that is, is inclined relative to the surface direction.

The metal thin film 6 has a thickness of, for example, 50 nm or more, preferably 100 nm or more, and for example, 300 nm or less, preferably 200 nm or less. When the metal thin film 6 is made of two layers of the first thin film and the second thin film, the first thin film has a thickness of, for example, 10 or more and 60 nm or less, and the second thin film has a thickness of, for example, 50 nm or more and 200 nm or less.

To provide the metal thin film 6 on the intermediate insulating layer 5, for example, sputtering method, or plating method is used, and preferably, sputtering method is used.

2-6. Step (3)

As shown in FIG. 2F, in the step (3), the photoresist 10 is provided on the metal thin film 6.

Examples of the photoresist 10 include negative or positive photoresist, and preferably, a negative photoresist is used. Examples of the photoresist 10 also include a dry film photoresist (DFR).

The photoresist 10 allows the light in the step (4) (ref: FIG. 2G) (e.g., ultraviolet ray, etc.) to partially pass through. To be specific, the photoresist 10 has a transmissivity for ultraviolet ray of, for example, 10% or more, preferably 20% or more, and for example, 60% or less, preferably 50% or less.

The above-described photoresist 10 is disposed on the metal thin film 6.

At that time, the dry film photoresist is pressed (pushed against), for example, by using a flat plate. Therefore, the photoresist 10 has a flat top face.

The thickness x of the photoresist 10 is not particularly limited, and for example, the thickness x of the photoresist 10 is 10 μm or more, and for example, 50 μm or less, preferably 30 μm or less.

2-7. Step (4)

As shown in FIG. 2G and FIG. 6A, in the step (4), the photomask 13 is disposed so that the to-be-portion 12 of the photoresist 10 is shielded from light, and the photoresist 10 is exposed to light through the photomask 13.

The to-be-portion 12 is a portion that is to be shielded from light in the step (4). The to-be-portion 12 is, as shown in FIG. 3H and FIG. 6B, a portion to be removed in the step (5). Furthermore, the to-be-portion 12 is also a portion, as shown in FIG. 3I and FIG. 6B in the phantom line, where the second conductive pattern 7 should be provided (charged with the second conductive pattern 7) in the opening 16 (described later) of the photoresist 10 in the step (6).

The to-be-portion 12 is included in the flat face 17 when projected in the thickness direction. Meanwhile, the portion other than the to-be-portion 12 in the photoresist 10 includes, when projected in the thickness direction, the inclined face 18. The to-be-portion 12 includes a portion that is not matching the first conductive pattern 4 when projected in the thickness direction, and the portion is displaced from the first conductive pattern 4 by (interval in left-right direction is), for example, 1 μm or more, preferably 5 μm or more, and for example, 300 μm or less, preferably 100 μm or less.

The photomask 13 has a translucent portion 14 that allows light from above to pass through below and a light shield portion 15 that allows light from above to be shielded to below.

In the step (4), the photomask 13 is disposed so that the light shield portion 15 faces the to-be-portion 12 and the translucent portion 14 faces the portion other than the to-be-portion 12 in the photoresist 10. The light shield portion 15 is included in the flat face 17 when projected in the thickness direction. The translucent portion 14 includes the inclined face 18 when projected in the thickness direction.

The photomask 13 is disposed above the photoresist 10 to face the photoresist 10 in spaced-apart relation. Alternatively, although not shown in FIG. 2G and FIG. 6A, the photomask 13 can be made to contact the top face of the photoresist 10.

In this manner, the photomask 13 is disposed so that the to-be-portion 12 in the photoresist 10 is shielded from light. Furthermore, the photomask 13 is disposed so that the portion other than the to-be-portion 12 in the photoresist 10 is shielded from light.

Then, in the step (4), the photoresist 10 is exposed to light through the photomask 13.

To expose the photoresist 10 to light, light is applied to the photomask 13 from the light source disposed above the photomask 13. The wavelength of the light is, for example, 100 nm or more, preferably 350 nm or more, and for example, 800 nm or less, preferably 450 nm or less. The application amount (exposure) is, for example, 100 mJ/cm$^2$ or more, and 800 mJ/cm$^2$ or less.

Then, light A applied to the light shield portion 15 is shielded from light by the light shield portion 15, and does not reach the to-be-portion 12.

Meanwhile, light B applied to the translucent portion 14 facing the flat face 17 in the thickness direction passes through the translucent portion 14 downward, reaches the top face of the photoresist 10, and then enters into the photoresist 10. Then, a portion of the light B passes through the photoresist 10 downward, and reflects at the top face of the metal thin film 6. That is, reflected light B' is produced. At that time, the reflected light B' aims upward, and therefore passes through the photoresist 10 upward.

Meanwhile, the light C applied to the translucent portion 14 facing the inclined face 18 in the thickness direction passes through the translucent portion 14 downward, reaches the top face of the photoresist 10, and then enters into the photoresist 10. Then, a portion of the light C passes through the photoresist 10 downward, and is reflected at the top face of the metal thin film 6. That is, reflected light C' is produced. At that time, the reflected light C' aims obliquely one side in the width direction. The angle of the reflected light C' corresponds to the above-described supplementary angle y, and therefore the angle θ1 formed by the incident light C and the reflected light C' can be made small. Therefore, the reflected light C' is suppressed from aiming toward the to-be-portion 12, and most of the reflected light C' substantially aims upward. Therefore, the reflected light C' passes through the portion other than the to-be-portion 12 in the photoresist 10.

In this manner, when the photoresist 10 is exposed to light in the step (4), the light is reflected by the metal thin film 6 positioned above the inclined face 18, reducing the light projected to the to-be-portion 12.

2-8. Step (5)

As shown in FIG. 3H and FIG. 6B, in the step (5), the to-be-portion 12 of the photoresist 10 shielded from light by the photomask 13 is removed.

To be specific, first, as necessary, the photoresist 10 after being exposed to light is heated (heating after exposure).

Then, the photoresist 10 is developed with a developer. In this manner, while retaining the portion other than the to-be-portion 12 in the photoresist 10, only the to-be-portion 12 is removed. That is, in the photoresist 10, an opening 16 corresponding to the to-be-portion 12 is formed. The opening 16 penetrates the photoresist 10 in the thickness direction.

In this manner, the metal thin film 6 corresponding to the to-be-portion 12, that is, the metal thin film 6 confronting with the opening 16 is exposed.

Thereafter, as necessary, the photoresist 10 is cured by heating.

2-9. Step (6)

As shown in the phantom line of FIG. 3I and FIG. 6B, in the step (6), the second conductive pattern 7 is provided on the metal thin film 6 exposed from the photoresist 10.

The second conductive pattern 7 integrally includes a plurality of second wires 26 (only a single wire is shown in FIG. 3I) extending in front-back direction, and second terminals (not shown) connected to both front and rear end portions of the plurality of second wires 26. The second wire 26 has, for example, when viewed in cross section, a generally rectangular shape having a left-right direction length (width) that is longer than an up-down direction length (thickness).

The second conductive pattern 7 includes a portion that is not matching the first conductive pattern 4 when projected in the thickness direction, and the amount of displacement of the portion (interval in left-right direction) is, for example, 1 μm or more, preferably 5 μm or more, and for example, 300 μm or less, preferably 100 μm or less.

The second conductive pattern 7 is made of a conductive material that is the same as that of the first conductive pattern 4.

The size of the second conductive pattern 7 is set suitably. The second conductive pattern 7 has a thickness of, for example, 1 μm or more, preferably 3 μm or more, and for example, 20 μm or less, preferably 12 μm or less. The second wire 26 has a width of, for example, 5 μm or more, preferably 8 μm or more, and for example, 200 μm or less, preferably 100 μm or less. The interval between the second wire 26 adjacent to each other is, for example, 5 μm or more, preferably 8 μm or more, and for example, 200 μm or less, preferably 100 μm or less.

To provide the second conductive pattern 7 on the metal thin film 6, electrolytic plating in which electricity is supplied from the metal thin film 6 is used.

The second conductive pattern 7 can be integrated with the metal thin film 6 positioned below the second conductive pattern 7.

2-10. Step (iv)

As shown in FIG. 3J, in the step (iv), the photoresist 10 is removed.

To be specific, the photoresist 10 is removed, for example, by wet etching.

2-11. Step (v)

As shown in FIG. 4K, in the step (v), the metal thin film 6 corresponding to the photoresist 10 is removed.

To be specific, the metal thin film 6 positioned below the photoresist 10 is removed, for example, by peeling.

2-12. Step (vi)

As shown in FIG. 4 L, in the step (vi), the insulating cover layer 9 is provided in a pattern by which the second wire 26 of the second conductive pattern 7 is covered and the second terminal (not shown) is exposed.

The suspension board with circuits 1 including the following is produced in this manner: the metal supporting board 2, the insulating base layer 3 provided on the metal supporting board 2, the first conductive pattern 4 provided on the insulating base layer 3, the intermediate insulating layer 5 provided on the insulating base layer 3 and covering the first conductive pattern 4, the metal thin film 6 and the second conductive pattern 7 disposed on the intermediate insulating layer 5, and the insulating cover layer 9 provided on the intermediate insulating layer 5 and covering the metal thin film 6 and the second conductive pattern 7. In the suspension board with circuits 1, the metal thin film 6 is integrated with the second conductive pattern 7. To be specific, the metal thin film 6 can be integrated as a portion of the second conductive pattern 7.

3. Intermediate Insulating Layer

The suspension board with circuits 1 is produced by the above-described production method. Therefore, the supplementary angle y to the angle α formed with the inclined face 18 and the flat face 17 in the intermediate insulating layer 5, that is, the gradient of the inclined face 18 relative to the flat face 17 is more than 0 degree, and furthermore, 5 degrees or more. The supplementary angle y is 20 degrees or less, preferably less than 20 degrees, more preferably 15 degrees or less, more preferably 12 degrees or less.

Figure 7A:
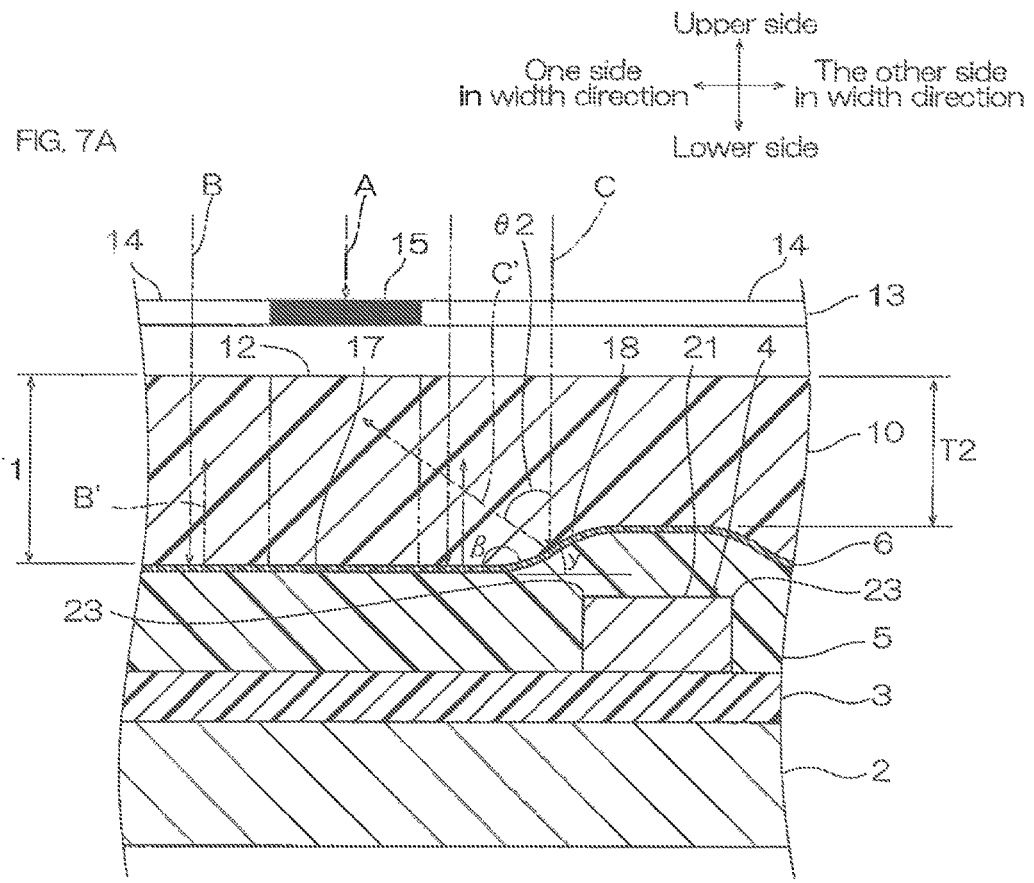
FIG. 7A and FIG. 7B are enlarged cross-sectional views of the suspension board with circuits of Comparative Example 1, FIG. 7A illustrating an enlarged view corresponding to FIG. 2G, FIG. 7B illustrating an enlarged view corresponding to FIG. 3H.
Figure 7B:
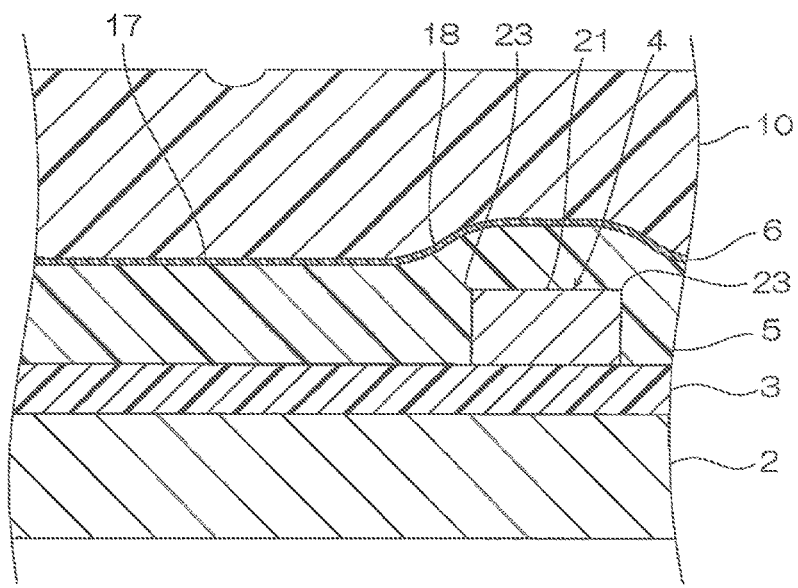

When the supplementary angle y is more than the above-described upper limit, in the step (4), as shown in FIG. 7A and FIG. 7B, angle θ2 formed with the incident light C and the reflected light C' becomes large. Therefore, the reflected light C' cannot reduce the light projected to the to-be-portion 12, and therefore, deformation of the second conductive pattern 7 is caused.

4. Operations and Effects of First Embodiment

With the method for producing a suspension board with circuits 1 of Comparative Example 1 shown in FIG. 7A, in the step (1), when the ratio of the thickness T1 of the intermediate insulating layer 5 relative to the thickness T0 of the first conductive pattern 4 (T1/T0) is set to less than the above-described lower limit, the supplementary angle y' exceeds the above-described range. Therefore, in the step (4), as shown in FIG. 7A, angle θ2 formed by light C (incident light C) that is applied to the translucent portion 14 and that faces the inclined face 18 in the thickness direction, and reflected light C' produced therein becomes relatively large. Therefore, the reflected light C' is projected toward obliquely above one side in the width direction, the projection to the to-be-portion 12 cannot be suppressed, and the to-be-portion 12 receives light (exposed to light). In such a case, as shown in FIG. 7B, in the step (5), the to-be-portion 12 cannot be removed, and therefore the metal thin film 6 cannot be exposed. Thus, in the electrolytic plating of the step (6), the second conductive pattern 7 cannot be provided reliably, and therefore, deformation such as breakage of the second conductive pattern 7 is generated.

Meanwhile, with the method for producing a suspension board with circuits 1, in the step (4), as shown in FIG. 2G and FIG. 6A, when the photoresist 10 is exposed to light, reflection is caused by the metal thin film 6 positioned above the inclined face 18 to reduce the light projected to the to-be-portion 12, and therefore in the step (5), as shown in FIG. 3H and FIG. 6B, the to-be-portion 12 of the photoresist 10 is removed reliably, and in the step (6), as shown in the phantom line in FIG. 3I and FIG. 6B, the second conductive pattern 7 can be formed reliably. That is, unlike Japanese Unexamined Patent Publication No. 2014-127216, the layout of the provided second conductive pattern 7 can be made with high flexibility, and inadequate formation of the second conductive pattern 7 can be suppressed.

As a result, the suspension board with circuits 1 with excellent connection reliability can be produced.

To be specific, with the method for producing a suspension board with circuits 1, when the ratio (T1/T0) is the above-described lower limit or more, the above-described supplementary angle y is the above-described upper limit value or less, and therefore the angle θ1 formed with the incident light C and the reflected light C' reflected at the metal thin film 6 corresponding to the inclined face 18 can be made small. Therefore, the reflected light C' can be made substantially upward, and as a result, in the step (4), as shown in FIG. 2G and FIG. 6A, the reflected light C' projected to the to-be-portion 12 can be reliably reduced.

5. Modified Example

Figure 8A:
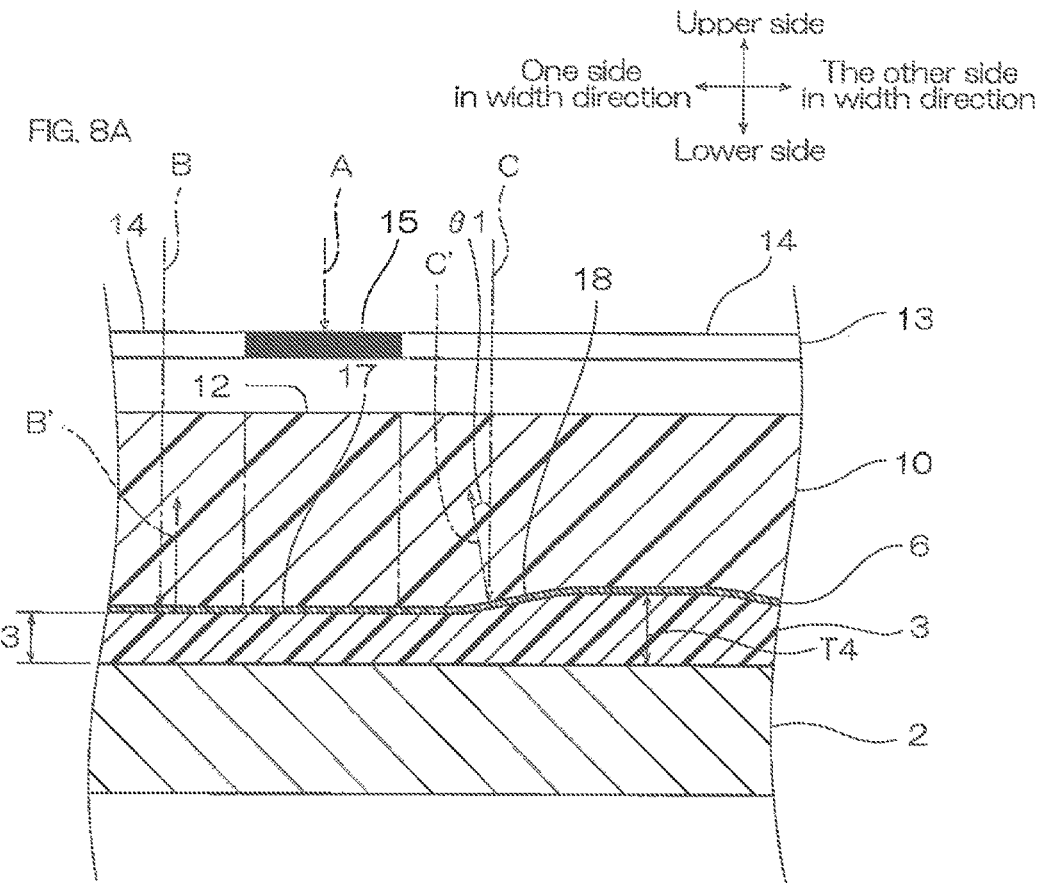
FIG. 8A and FIG. 8B are enlarged cross-sectional views of the suspension board with circuits in Modified example of an embodiment, FIG. 8A illustrating an enlarged view corresponding to FIG. 2G, and FIG. 8B illustrating an enlarged view corresponding to FIG. 3H.

The inclined face 18 of the intermediate insulating layer 5 corresponds to the ridgeline portion 23 of the first conductive pattern 4. But as shown in FIG. 8A, the insulating base layer 3 can also form the inclined face 18 by the following method: the inclined face 18 does not correspond to the first conductive pattern 4, and simply the insulating base layer 3 as an example of the insulating layer has a plurality of thicknesses T3 and T4.

Figure 8B:
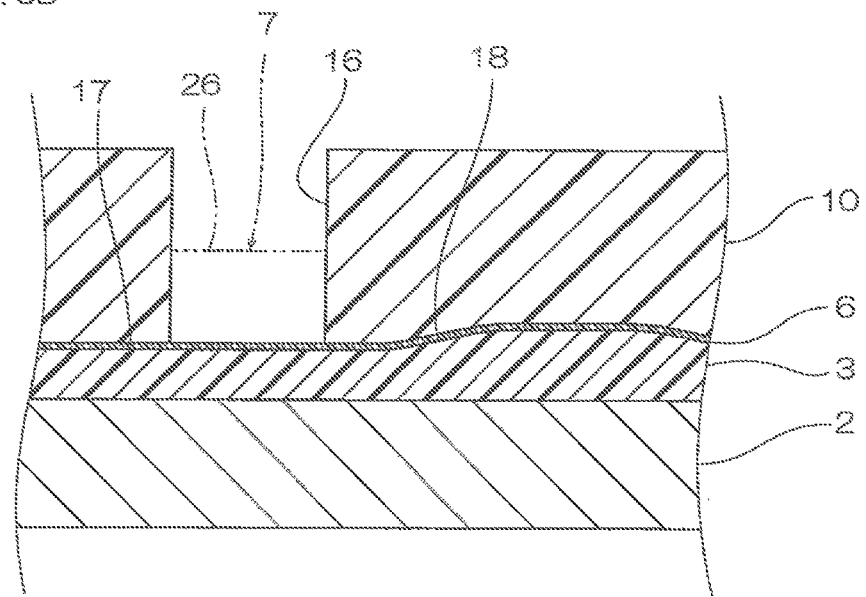

That is, the suspension board with circuits 1 includes, as shown in FIG. 8B, the metal supporting board 2, the insulating base layer 3, the metal thin film 6 and second conductive pattern 7, and the insulating cover layer 9 (ref: FIG. 4K) sequentially, and does not include the first conductive pattern 4 and the intermediate insulating layer 5.

This Modified example also achieves the same operations and effects as in the first embodiment.

Although the description is given using the suspension board with circuits 1 as the first embodiment of the wired circuit board of the present invention, for example, a flexible wired circuit board having no metal supporting board 2 can also be used. In such a case, the flexible wired circuit board includes, although not shown, the metal supporting board 2, the insulating base layer 3, the first conductive pattern 4, the intermediate insulating layer 5, the metal thin film 6, the second conductive pattern 7, and the insulating cover layer 9.

EXAMPLES

In the following, the present invention is described further in detail based on Examples and Comparative Examples. However, the present invention is not limited to these Examples and Comparative Examples. The specific numeral values used in the description below such as mixing ratios (contents), physical property values, and parameters can be replaced with the upper limit (numeral values defined with "or less", "less than") or the lower limit (numeral values defined with "or more", "more than") of the corresponding mixing ratios (contents), physical property values, and parameters in the above-described Description of Embodiments.

Example 1 (Example Corresponding to First Embodiment)

As shown in FIG. 1A, first, a metal supporting board 2 made of stainless steel and having a thickness of 20 μm was prepared (step (i)).

As shown in FIG. 1B, then, an insulating base layer 3 made of polyimide and having a thickness of 10 μm was provided on the metal supporting board 2 (step (ii)).

As shown in FIG. 1C, then, a first conductive pattern 4 made of copper was provided on the insulating base layer 3 (step (iii)). The first conductive pattern 4 had a thickness of 9 μm. The first wire 21 had a width of 20 μm.

As shown in FIG. 1D, then, an intermediate insulating layer 5 made of polyimide was provided on the insulating base layer 3 so as to cover the first conductive pattern 4 (step (1)). The thickness T1 was 15 μm, and the thickness T2 was 12 μm. The angle α formed with the inclined face 18 and the flat face 17 was 168 degrees, and the supplementary angle y was 12 degrees.

As shown in FIG. 2E, then, the metal thin film 6 made of the chromium thin film having a thickness of 30 nm and the copper thin film having a thickness of 70 μm was provided on the intermediate insulating layer 5 by sputtering method (step (2)).

As shown in FIG. 2F, then, the photoresist 10 was provided on the metal thin film 6 (step (3)). The photoresist 10 had a thickness of 20 μm.

As shown in FIG. 2G and FIG. 6A, then, the photomask 13 was disposed so that the to-be-portion 12 in the photoresist 10 is shielded from light (step (4)). To be specific, the photomask 13 was disposed so that the light shield portion 15 faces the to-be-portion 12, and the translucent portion 14 faces the portion other than the to-be-portion 12 of the photoresist 10.

Then, the photoresist 10 was exposed to light through the photomask 13 (step (4)).

As shown in FIG. 3H and FIG. 6B, then, the to-be-portion 12 of the photomask 10 was removed by developing, thereby exposing the metal thin film 6 corresponding to the to-be-portion 12 (step (5)).

As shown in the phantom line in FIG. 3I and FIG. 6B, then, a second conductive pattern 7 was provided on the metal thin film 6 exposed from the photoresist 10 by electrolytic copper plating with electricity supplied from the metal thin film 6 (step (6)). The second conductive pattern 7 had a thickness of 9 μm. The second wire 26 had a width of 20 μm.

As shown in FIG. 3J, then, the photoresist 10 was removed by etching (step (iv)).

As shown in FIG. 4K, then, the metal thin film 6 corresponding to the photoresist 10 was removed by peeling (step (v)).

As shown in FIG. 4 L, then, the insulating cover layer 9 made of polyimide and having a thickness of 5 μm was provided on the intermediate insulating layer 5 so as to cover the second conductive pattern 7 (step (vi)).

The suspension board with circuits 1 was produced in this manner That is, the suspension board with circuits 1 includes the metal supporting board 2, the insulating base layer 3, the first conductive pattern 4, the intermediate insulating layer 5, the second conductive pattern 7, and the insulating cover layer 9.

No inadequate formation such as breakage was observed in the second conductive pattern 7.

Example 2 (Example Corresponding to First Embodiment)

A suspension board with circuits 1 was produced in the same manner as in Example 1, except that in the step (1) shown in FIG. 1D, the thickness T1 of the intermediate insulating layer 5 was changed to 12 μm, the thickness T2 was changed to 8 μm, and furthermore, the angle α was changed to 160 degrees, and the supplementary angle y was changed to 20 degrees.

Inadequate formation was observed a little in the second conductive pattern 7.

Comparative Example 1

A suspension board with circuits 1 was produced in the same manner as in Example 1, except that in the step (1) shown in FIG. 1D, the thickness T1 of the intermediate insulating layer 5 was changed to 6 μm, the thickness T2 was changed to 5 μm, and furthermore, the angle α was changed to 150 degrees, and the supplementary angle y was changed to 30 degrees.

The second conductive pattern 7 was inadequately formed, and complete breakage portions were observed.

Table 1 shows the thickness, the angle, and the evaluation for the intermediate insulating layer 5 of Examples 1 to 2 and Comparative Example 1.

TABLE 1

|  | Intermediate insulation layer 5 | | | | Photoresist 10 | Evaluation |
| --- | --- | --- | --- | --- | --- | --- |
|  | Thickness T1 μm | Thickness T2 μm | Angle α between inclined face18 and flat face 17 Degrees | Complementary angle y Degrees | Thickness X μm | Inadequate formation of second conductive pattern |
| Example 1 | 15 | 12 | 168 | 12 | 20 | Not observed |
| Example 2 | 12 | 8 | 160 | 20 | 20 | Observed slightly |
| Comparative Example 1 | 6 | 5 | 150 | 30 | 20 | Breakage |

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

What is claimed is:

1. A wired circuit board comprising:
a first insulating layer;
a first conductive pattern provided on the first insulating layer;

a second insulating layer provided on the first insulating layer and covering the first conductive pattern; and a second conductive pattern provided on a top face in a thickness direction of the second insulating layer, wherein the top face of the second insulating layer includes an inclined face and a flat face, wherein the inclined face swells from the flat face so as to correspond to a ridgeline of the first conductive pattern, wherein the second conductive pattern is provided on the flat face and is offset from the first conductive pattern and the inclined face when projected in the thickness direction of the second insulating layer, wherein an interval between the second conductive pattern and the first conductive pattern is in a range of 1 μm to 300 μm when viewed in a plan view, wherein the inclined face and the flat face form an angle therebetween, and form a supplementary angle y to the angle formed by the inclined face and the flat face, and wherein the supplementary angle y to the angle formed by the inclined face and the flat face is more than 0 degree and 20 degrees or less.

2. The wired circuit board according to claim 1, wherein the supplementary angle y to the angle formed by the inclined face and the flat face is 5 degrees or more and 20 degrees or less.

* * * * *